(12) United States Patent
Kim

(10) Patent No.: US 7,239,507 B1
(45) Date of Patent: Jul. 3, 2007

(54) SLOT FRAME WITH GUIDE TABS FOR REDUCING EMI GAPS

(75) Inventor: David K. J. Kim, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 221 days.

(21) Appl. No.: 10/807,743

(22) Filed: Mar. 24, 2004

(51) Int. Cl.
*H05K 5/00* (2006.01)
*H05K 7/00* (2006.01)

(52) U.S. Cl. .................................... 361/683; 174/35 R
(58) Field of Classification Search ................ 361/683; 174/35 R
See application file for complete search history.

(56) References Cited

U.S. PATENT DOCUMENTS

| | | | |
|---|---|---|---|
| 5,166,772 A | 11/1992 | Soldner et al. | |
| 5,180,905 A | 1/1993 | Chen et al. | |
| 5,256,867 A | 10/1993 | Chen | |
| 5,294,826 A | 3/1994 | Marcantonio et al. | |
| 5,357,404 A | 10/1994 | Bright et al. | |
| 5,561,265 A | 10/1996 | Livshits et al. | |
| 5,566,052 A | 10/1996 | Hughes | |
| 5,586,011 A | 12/1996 | Alexander | |
| 5,639,989 A | 6/1997 | Higgins, III | |
| 5,748,455 A | 5/1998 | Phillips et al. | |
| 5,825,634 A | 10/1998 | Moorehead, Jr. | |
| 5,929,376 A * | 7/1999 | Doun et al. ................. | 174/369 |
| 5,947,571 A * | 9/1999 | Ho .......................... | 312/265.6 |
| 6,057,600 A | 5/2000 | Kitazaw et al. | |
| 6,063,999 A | 5/2000 | Kelly | |
| 6,088,231 A | 7/2000 | Fajardo | |
| 6,137,051 A | 10/2000 | Bundza | |
| 6,140,577 A | 10/2000 | Rapaich et al. | |
| 6,198,630 B1 | 3/2001 | Cromwell | |
| 6,219,239 B1 | 4/2001 | Mellberg et al. | |

(Continued)

FOREIGN PATENT DOCUMENTS

WO 03/041466 5/2003

OTHER PUBLICATIONS

Radu, et al., "Investigation of Internal Partitioning in Metallic Enclsosures for EMI Control," Sun Microsystems, Inc, et al., Jun. 1997, pp. 171-176.

(Continued)

*Primary Examiner*—Lisa Lea-Edmonds
*Assistant Examiner*—Ingrid Wright
(74) *Attorney, Agent, or Firm*—Robert C. Kowert; Meyertons, Hood, Kivlin, Kowert & Goetzel, P.c.

(57) ABSTRACT

An apparatus for reducing shielding gaps associated with the mounting of peripheral cards in a computer system. A computer system chassis includes a frame mounted thereupon, the frame having at least one opening adjacent to a peripheral card slot. The frame includes a plurality of tabs arranged around the opening, wherein the tabs on one side of the opening are staggered with respect to the tabs on the other side of the opening. A shield bracket configured for coupling to a peripheral card mountable in the slot is slidable to cover the opening. When the shield bracket is slid into position to cover the opening, the shield bracket is retained by the plurality of tabs. The frame and the slot bracket are made of a flexible, electrically conductive material.

14 Claims, 2 Drawing Sheets

U.S. PATENT DOCUMENTS

| | | |
|---|---|---|
| 6,219,254 B1 | 4/2001 | Akerling et al. |
| 6,239,359 B1 | 5/2001 | Lilienthal, II et al. |
| 6,252,313 B1 | 6/2001 | Zhang et al. |
| 6,259,609 B1 | 7/2001 | Kurz |
| 6,269,863 B1 | 8/2001 | Wyler |
| 6,278,617 B1 | 8/2001 | Yang et al. |
| 6,288,330 B1 | 9/2001 | Chen |
| 6,294,407 B1 | 9/2001 | Jacobs |
| 6,297,551 B1 | 10/2001 | Dudderar et al. |
| 6,320,257 B1 | 11/2001 | Jayaraj et al. |
| 6,324,074 B1 | 11/2001 | Lunden |
| 6,339,253 B1 | 1/2002 | Corisis |
| 6,339,536 B1 * | 1/2002 | Buican et al. ............... 361/818 |
| 6,349,043 B1 * | 2/2002 | Jensen et al. ............... 361/818 |
| 6,362,977 B1 | 3/2002 | Tucker et al. |
| 6,400,164 B1 | 6/2002 | Sampath |
| 6,473,295 B2 * | 10/2002 | Chen .......................... 361/683 |
| 6,483,406 B1 | 11/2002 | Sawa et al. |
| 6,525,407 B1 | 2/2003 | Drewery |
| 6,573,590 B1 | 6/2003 | Radu et al. |
| 6,597,575 B1 | 7/2003 | Matayabes et al. |
| 6,654,256 B2 * | 11/2003 | Gough ....................... 361/816 |
| 6,661,670 B1 * | 12/2003 | Eckberg et al. ............. 361/752 |
| 6,683,796 B2 | 1/2004 | Radu et al. |
| 6,703,704 B1 | 3/2004 | Alcoe et al. |
| 6,723,915 B2 | 4/2004 | Radu et al. |
| 6,822,877 B2 * | 11/2004 | Chen .......................... 361/801 |

OTHER PUBLICATIONS

Article: "Identifying an EMI Source and Coupling Path in a Computer System with Sub-Module Testing"; Radu, et al.; Electromagnetic Compatibility Laboratory, Dept. of Electrical Engineering, University of Missouri-Rolla, Rolla, MO and Electromagnetic Compatibility Group, Sun Microsystems, Mountain View, CA; pp. 165-170.

Article: "Intel® Pentium® 4 Processor in the 423-Pin Package EMI Guideline"; Oct. 2000; © Intel Corporation.

Article: "Mechanical Enabling Efforts"; Fall 2000; Intel Developer Forum; © Intel Corporation.

* cited by examiner

SLOT FRAME WITH GUIDE TABS FOR REDUCING EMI GAPS

BACKGROUND OF THE INVENTION

1. Field of the Invention

This invention relates to computer systems, and more particularly, the prevention of the leakage of electromagnetic energy through a computer system chassis.

2. Description of the Related Art

One important aspect in the design of computers and electronic systems is the shielding of electromagnetic energy. In the design of most electronic systems, it is desirable to shield the system from unwanted electromagnetic interference from external sources, as well as to contain electromagnetic energy generated by the system itself. Furthermore, certain government regulations (e.g., Federal Communications Commission requirements) may necessitate that electronic systems be designed to contain electromagnetic noise within certain specifications.

Computers and other electronic systems are typically contained within an enclosure that includes a chassis. Due to the operation of various components in such an electronic system, electromagnetic energy may be coupled to the chassis. This energy may translate into currents that are conducted on the interior of the chassis surface. While the chassis may be designed with a minimal number of slots and/or other apertures to contain internally generated electromagnetic energy from escaping (or externally generated electromagnetic energy from entering), apertures that may be present in the chassis may allow electromagnetic energy to enter or escape. For example, gaps in a computer system chassis may exist in locations where peripheral cards have been inserted (e.g., a PCI, or peripheral component interface, slot). Such gaps may allow electromagnetic energy to escape the chassis, or externally generated electromagnetic energy to enter the interior of the chassis. Such electromagnetic energy may lead to EMI.

SUMMARY OF THE INVENTION

An apparatus for reducing shielding gaps associated with the mounting of peripheral cards in a computer system is disclosed. In one embodiment, a computer system chassis includes a frame mounted thereupon, the frame having at least one opening adjacent to a peripheral card slot. The frame includes a plurality of tabs arranged around the opening, wherein the tabs on one side of the opening are staggered with respect to the tabs on the other side of the opening. A shield bracket configured for coupling to a peripheral card mountable in the slot is slidable to cover the opening. When the shield bracket is slid into position to cover the opening, the shield bracket is retained by the plurality of tabs. The frame and the slot bracket are made of a flexible, electrically conductive material. Since both the frame and the slot bracket are made of a flexible material, both the frame and the slot bracket will flex together when a peripheral card coupled to the slot bracket is inserted into the peripheral card slot.

In one embodiment, the apparatus includes one or more spring fingers inserted into any gaps between the slot bracket and the frame. The spring fingers are made of a flexible, electrically conductive material.

The combination of the slot bracket and the frame may serve to reduce or eliminate the escaping of electromagnetic energy from the computer system chassis in the vicinity of the peripheral card slot. The spring fingers may further assist in the reduction or elimination of electromagnetic energy escaping from the computer system chassis.

BRIEF DESCRIPTION OF THE DRAWINGS

Other aspects of the invention will become apparent upon reading the following detailed description and upon reference to the accompanying drawings in which.

Figure 1:
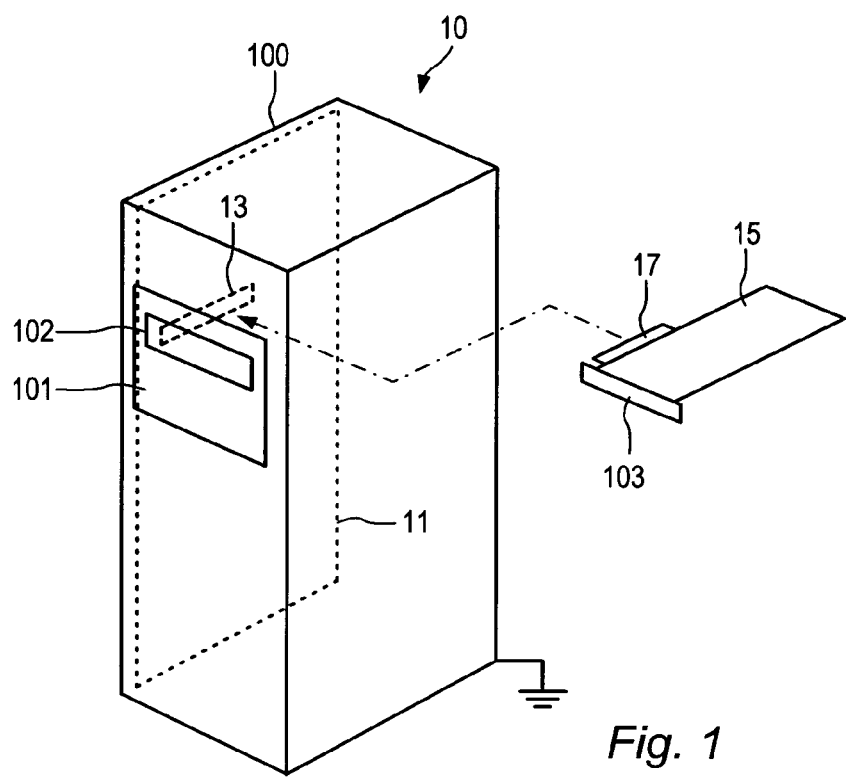
FIG. 1 is a drawing of one embodiment of a computer system.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, a drawing of one embodiment of a computer system is shown. In the embodiment shown, computer system 10 includes a chassis 100. A system board 11, including a peripheral card slot 13, is mounted within chassis 100. System board 11 may include a plurality of electronic components that are capable of generating electromagnetic energy when operating. Peripheral card slot is configured for receiving a peripheral card such as peripheral card 15. In one embodiment, peripheral card slot 13 includes a connector configured to receive an edge connector, such as edge connector 17 of peripheral card 15. Peripheral card slot 13 and peripheral card 15 may conform to various types of standards, such as the PCI (Peripheral Component Interface) standard.

In addition to system board 11 and peripheral card 15, other circuit carriers and electronic devices may also be present in computer system 10. This may include (but is not limited to) additional peripheral cards, electronic devices mounted upon the system board (e.g., processors, memory, etc.), storage devices, and so forth.

Chassis 100 may include a frame 101 near peripheral card slot 13. Frame 101 includes an opening 102 adjacent to peripheral card slot 13 which may allow for any required external connections to the card, if present. When peripheral card 15 is mounted to system board 11 (via peripheral card slot 13), shield bracket 103 (attached to peripheral card 15) may cover the opening 102. Both shield bracket 103 and frame 101 may be made of an electrically conductive material (e.g., copper, beryllium, a conductive alloy, etc.). Furthermore, both shield bracket 103 and frame 101 may be flexible such that, if any flexing results when peripheral card 15 is mounted to system board 11, both shield bracket 103 and frame 101 flex together. That is, both shield bracket 103 and frame 101 may flex in the same direction. For example, if shield bracket 103 is forced to bow outward when peripheral card 15 is mounted to system board 11, frame 101 may also bow outward. This is in contrast to some prior art arrangements wherein stiffeners are used in order to prevent any type of bowing or flexing of either the frame or the shield bracket. In such arrangements, mechanical tolerance stackups may make mounting a peripheral card more difficult and may lead to significant gaps between the shield bracket and the frame. Thus, in the embodiment shown, no stiffener is present, thus allowing both the frame 101 and the shield bracket 103 to retain their flexibility.

As previously noted, both shield bracket 103 and frame 101 are made of an electrically conductive material. In addition, chassis 100 may be made of electrically conductive material, or may at least include a substantial amount of electrically conductive material. Furthermore, chassis 100 may be coupled to an electrical ground, and as such, frame 101 may also be coupled to the electrical ground through chassis 100. Thus, the combination of chassis 100, frame 101, and shield bracket 103 may provide shielding to prevent the escape of electromagnetic energy generated by electronic devices contained within the confines of chassis 100. Similarly, the combination of these elements may also prevent externally generated electromagnetic energy from entering the chassis and causing electromagnetic interference (EMI).

Figures 2A, 2B:
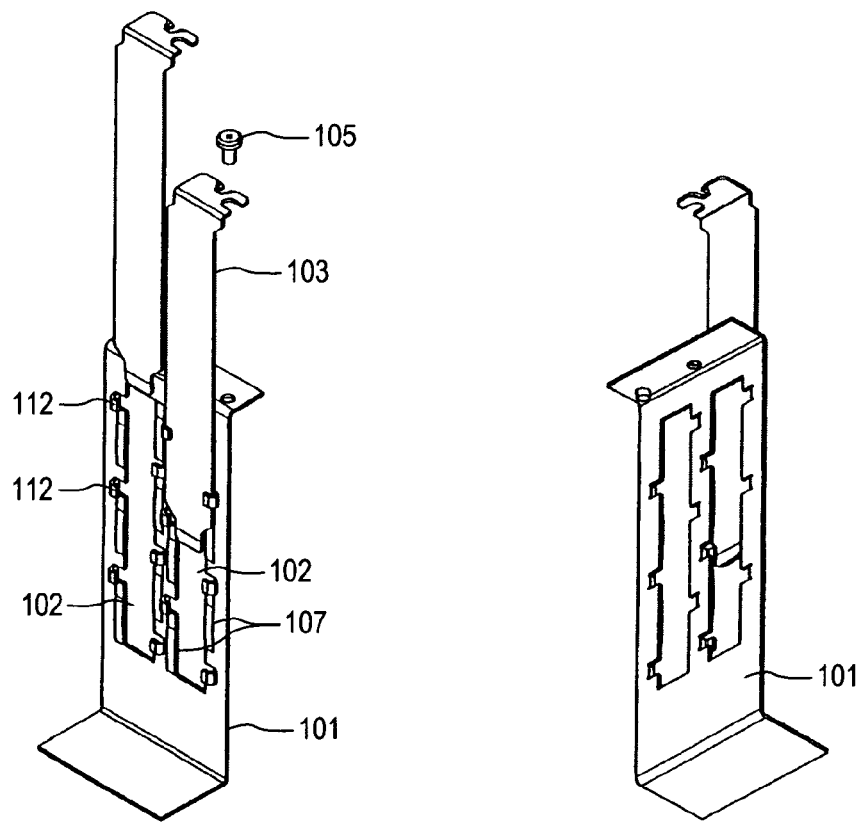
FIG. 2A is a drawing of one embodiment of a slot frame and shielding bracket for a computer system.
FIG. 2B is a drawing of one embodiment of a slot frame and shielding bracket for a computer system.

FIG. 2A is a drawing of one embodiment of a slot frame and shielding brackets for a computer system. In particular, the view of the embodiment shown in FIG. 2A is a view that would be seen from within a computer system chassis to which the frame is mounted. In the embodiment shown, frame 101 includes a pair of openings 102. Each of the openings 102 may be adjacent to a peripheral slot on a system board when frame 101 is mounted to a computer system chassis. Frame 101 includes a plurality of tabs 112 arranged on the sides of each of the openings 102. In the embodiment shown, each of the tabs 112 on one side of an opening 102 is staggered with respect to the tabs 112 on the other side of the opening 102. That is, the tabs 112 on one side of an opening 102 are arranged such that they are not directly opposite of the tabs 112 on the other side of the opening. The tabs are designed such that they aid in retaining a shield bracket 103 in place when a peripheral card is mounted in a peripheral slot adjacent to the opening, and as such, a shield bracket 103 is inserted between a horizontal portion of the tabs 112 and the frame 101. It should also be noted that a shield bracket 103 may be inserted to cover an opening 102 even if no peripheral card is present in the peripheral card slot adjacent to that opening.

The staggered arrangement of the tabs may tend to reduce the number and size of any gaps between frame 101 and an inserted shield bracket 103. Gaps between the frame 101 and an inserted shield bracket 103 may be further reduced by the presence of spring fingers 107. In the embodiment shown, a plurality of spring fingers 107 are shown arranged along the periphery of each opening 102 between tabs 112. Each of the spring fingers 107 may be made of a flexible, electrically conductive material. When a shield bracket 103 is inserted between tabs 112 and the main portion of frame 101, spring fingers 107 may conform to fill an area of a gap that would otherwise be present if no spring fingers 107 were mounted. Thus, the combination of staggered tabs 112, spring fingers 107, and the ability of frame 101 and shield brackets 103 to flex together may minimize or eliminate altogether any gaps through which electromagnetic energy would otherwise be able to pass.

When inserted, each shield bracket 103 may be secured to frame 101 by a fastener 105. Fastener 105 may be any suitable type of fastener, (e.g., a screw). Furthermore, some embodiments of fastener 105 may include multiple components, such as a nut and a bolt.

FIG. 2B is a drawing of the same apparatus as shown in FIG. 2A, with the view as would be seen from outside of the computer system chassis.

Figure 3:
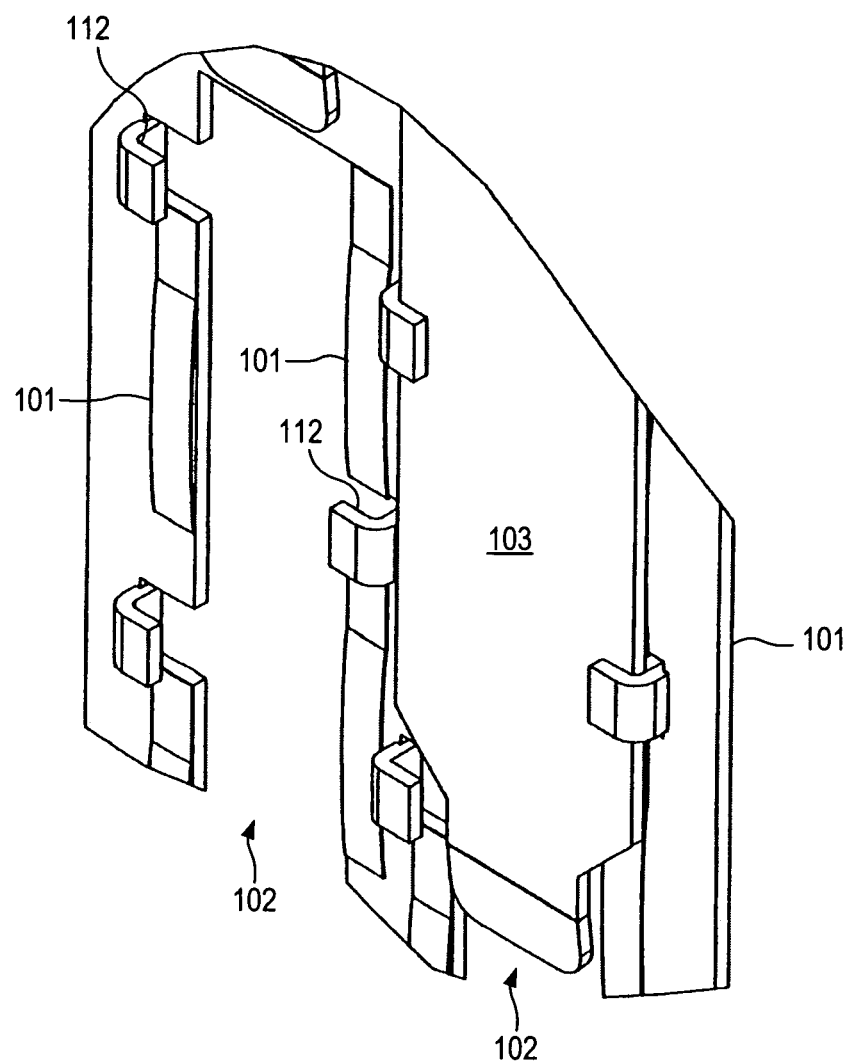
FIG. 3 is a drawing illustrating additional detail of a slot frame and shielding bracket with spring fingers to eliminate gaps.

Moving now to FIG. 3, a drawing illustrating additional detail of a slot frame and shielding bracket with spring fingers to eliminate gaps is shown. FIG. 3 illustrates the arrangement of frame 101, tabs 112, shield bracket 103 and spring fingers 107 in greater detail.

In the embodiment shown, a shield bracket 103 is being inserted between the retaining portion of tabs 112 and frame 101. Shield bracket 103 may be slid into position to cover the opening 102. A second opening 102 is also shown. A plurality of spring fingers 107 is arranged along the sides of the second opening 102. Although not shown due to the presence of shield bracket 103, a plurality of spring fingers 107 may also be arranged along the sides of the first opening 102. When shield bracket 103 is inserted, the spring fingers 107 are located between the shield bracket and frame 101. The spring fingers 107 may be compressed and thereby conform to the shapes of gaps between shield bracket 103 and frame 101. Thus, gaps that may otherwise exist between shield bracket 103 and frame 101 without the presence of spring fingers 107 may be filled. Since they are made of an electrically conductive material, spring fingers 107 may prevent the passage of electromagnetic energy.

Figure 4:
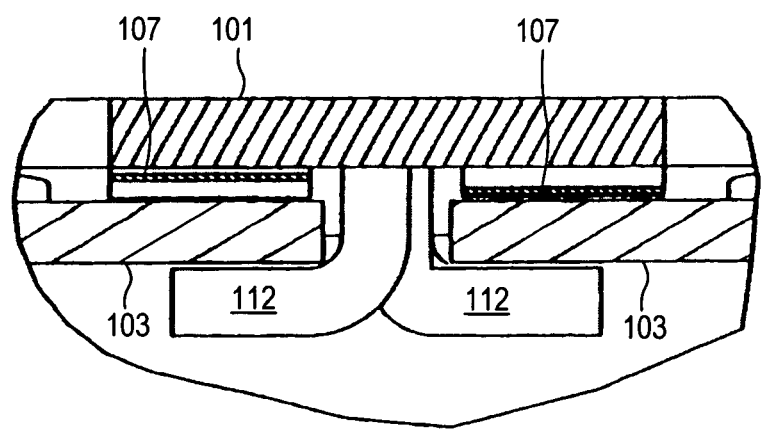
FIG. 4 is a drawing illustrating additional detail of a slot frame and shielding bracket with spring fingers to eliminate gaps.

Turning now to FIG. 4, a drawing illustrating additional detail of a slot frame and shielding bracket with spring fingers to eliminate gaps is shown. FIG. 4 is a top view illustrating the arrangement of frame 101, tabs 112, shield bracket(s) 103, and spring fingers 107.

In the embodiment shown, a shield bracket 103 is inserted in each of two locations. Spring fingers 107 are located between the shield brackets 103 and frame 101, and provide a means of sealing any gaps that may otherwise exist between frame 101 and the shield brackets 103. The shield brackets are held in position in part by tabs 112, although fasteners (as shown in FIG. 2A) may also be present.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An apparatus for reducing gaps associated with mounting peripheral cards in a computer system, the apparatus comprising:
   a chassis;
   a frame, the frame mounted on the computer system chassis, wherein the frame includes at least one opening adjacent to a peripheral card slot;
   wherein the frame includes a plurality of tabs arranged around the opening, wherein the tabs on one side of the opening are staggered with respect to the tabs on the other side of the opening; and
   a shield bracket, the shield bracket configured for coupling to a peripheral card mountable in the slot, wherein the shield bracket is slidable between a retaining portion of each of the plurality of tabs and a surface of the frame to cover the opening, and wherein, when covering the opening, the shield bracket is retained by the plurality of tabs;

wherein the frame and the shield bracket are made of a flexible electrically conductive material.

2. The apparatus as recited in claim 1 further comprising at least one spring finger inserted into a gap between the shield bracket and the frame.

3. The apparatus as recited in claim 2, wherein the spring finger is made of a flexible electrically conductive material.

4. The apparatus as recited in claim 1, further comprising a fastener, wherein the fastener is coupled to secure the shield bracket to the frame.

5. The apparatus as recited in claim 1, wherein the peripheral card slot is coupled to receive a peripheral component interface (PCI) card.

6. The apparatus as recited in claim 1, wherein the electrically conductive material includes copper.

7. The apparatus as recited in claim 1, wherein the electrically conductive material includes beryllium.

8. A computer system, comprising:
a chassis;
a system board located within the chassis;
a frame mounted on the chassis, wherein the frame includes at least one opening adjacent to the peripheral card slot, wherein the frame includes a plurality of tabs arranged around the opening, and wherein the tabs on one side of the opening are staggered with respect to the tabs on the other side of the opening;
a peripheral card, wherein the peripheral card is mountable in a slot on the system board; and
a shield bracket coupled to the peripheral card, wherein the shield bracket is slidable between a retaining portion of each of the plurality of tabs and a surface of the frame to cover the opening when the peripheral card is mounted in the slot, and wherein, when covering the opening, the shield bracket is retained by the plurality of tabs;

wherein the frame and the shield bracket are made of a flexible electrically conductive material.

9. The computer system as recited in claim 8 further comprising at least one spring finger inserted into a gap between the shield bracket and the frame.

10. The computer system as recited in claim 9, wherein the spring finger is made of a flexible electrically conductive material.

11. The computer system as recited in claim 8, further comprising a fastener, wherein the fastener is coupled to secure the shield bracket to the frame.

12. The computer system as recited in claim 8, wherein the peripheral card slot is coupled to receive a peripheral component interface (PCI) card.

13. The computer system as recited in claim 8, wherein the electrically conductive material includes copper.

14. The computer system as recited in claim 8, wherein the electrically conductive material includes beryllium.

* * * * *